United States Patent
Zhao et al.

(10) Patent No.: US 8,988,887 B2
(45) Date of Patent: Mar. 24, 2015

(54) ELECTRONIC DEVICE HOUSING WITH STRUCTURE FOR SECURING PRINTED CIRCUIT BOARD

(75) Inventors: Bao-Gang Zhao, Shenzhen (CN); Xue-Feng Wan, Shenzhen (CN); Ping Li, Shenzhen (CN); Yuan-Ming Wang, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 220 days.

(21) Appl. No.: 13/563,832

(22) Filed: Aug. 1, 2012

(65) Prior Publication Data

US 2013/0120945 A1    May 16, 2013

(30) Foreign Application Priority Data

Nov. 14, 2011    (CN) .......................... 201110359017.2

(51) Int. Cl.
*H05K 5/02* (2006.01)
*H05K 7/14* (2006.01)

(52) U.S. Cl.
CPC ..................................... *H05K 7/142* (2013.01)
USPC ....... 361/759; 361/740; 361/741; 361/679.32

(58) Field of Classification Search
CPC .................................. G06F 1/186; H05K 7/14
USPC .................................... 361/740, 759; 174/535
See application file for complete search history.

(56) References Cited

U.S. PATENT DOCUMENTS

| 5,144,533 | A | * | 9/1992 | Annett | 361/740 |
| 5,381,304 | A | * | 1/1995 | Theroux et al. | 361/706 |
| 5,508,887 | A | * | 4/1996 | Ozaki | 361/752 |
| 6,000,559 | A | * | 12/1999 | Stopyra et al. | 211/41.17 |
| 6,428,352 | B1 | * | 8/2002 | Boyden | 439/545 |

* cited by examiner

*Primary Examiner* — Jayprakash N Gandhi
*Assistant Examiner* — Mandeep Buttar
(74) *Attorney, Agent, or Firm* — Novak Druce Connolly Bove + Quigg LLP

(57) ABSTRACT

A housing of an electronic device comprises a fixing portion and a locking portion. The fixing portion is perpendicularly disposed on a side wall of the housing. The locking portion is perpendicularly mounted on the bottom of the housing. The locking portion corresponds to the fixing portion. The fixing portion clasps a first end of the circuit board. The locking portion is secured to a second end of the circuit board opposite to the first end to mount the circuit board to the housing after the first end of the circuit board has been clasped by the fixing portion.

18 Claims, 4 Drawing Sheets

ELECTRONIC DEVICE HOUSING WITH STRUCTURE FOR SECURING PRINTED CIRCUIT BOARD

BACKGROUND

1. Technical Field

The present disclosure relates to electronic devices.

2. Description of Related Art

Electronic devices, such as DVD players, include a cover, a plurality of screws, and a circuit board mounted inside the cover. The bottom of the cover includes several cylindrical fixing portions. Each of the cylindrical fixing portions defines a blind hole with a screw structure. The circuit board defines several through-holes corresponding to the blind holes. Fixing members, such as screws, extend through the through-holes and the blind holes to secure the circuit board to the cover. However, securing the circuit board to the cover requires a plurality of screws and the screwing operation requires a lot of time.

Therefore, there is room for improvement in the art.

BRIEF DESCRIPTION OF THE FIGURE

The components of the drawings are not necessarily drawn to scale, the emphasis instead being placed upon clearly illustrating the principles of the embodiment of an electronic device. Moreover, in the drawings, like reference numerals designate corresponding parts throughout several views.

DETAILED DESCRIPTION

Embodiments of the present disclosure will be described in detail with reference to the drawings.

Figure 1:
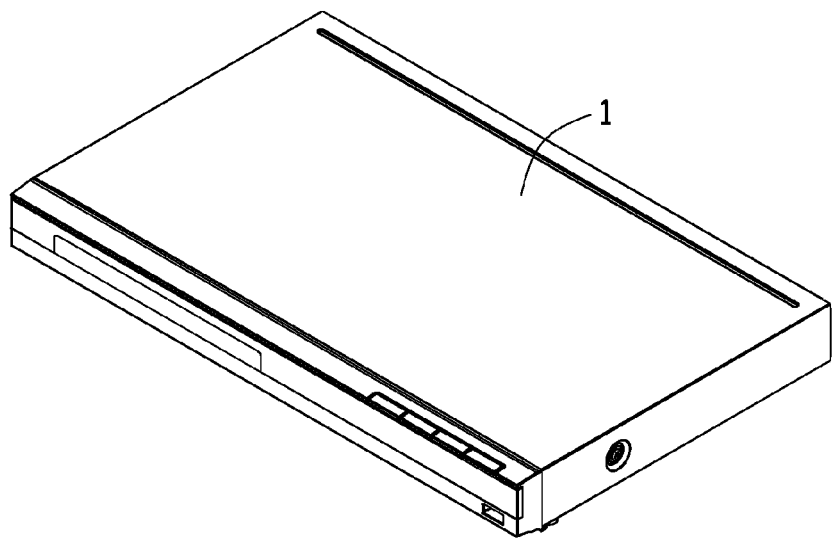
FIG. 1 is a schematic view of an electronic device, according to an embodiment.
Figure 2:
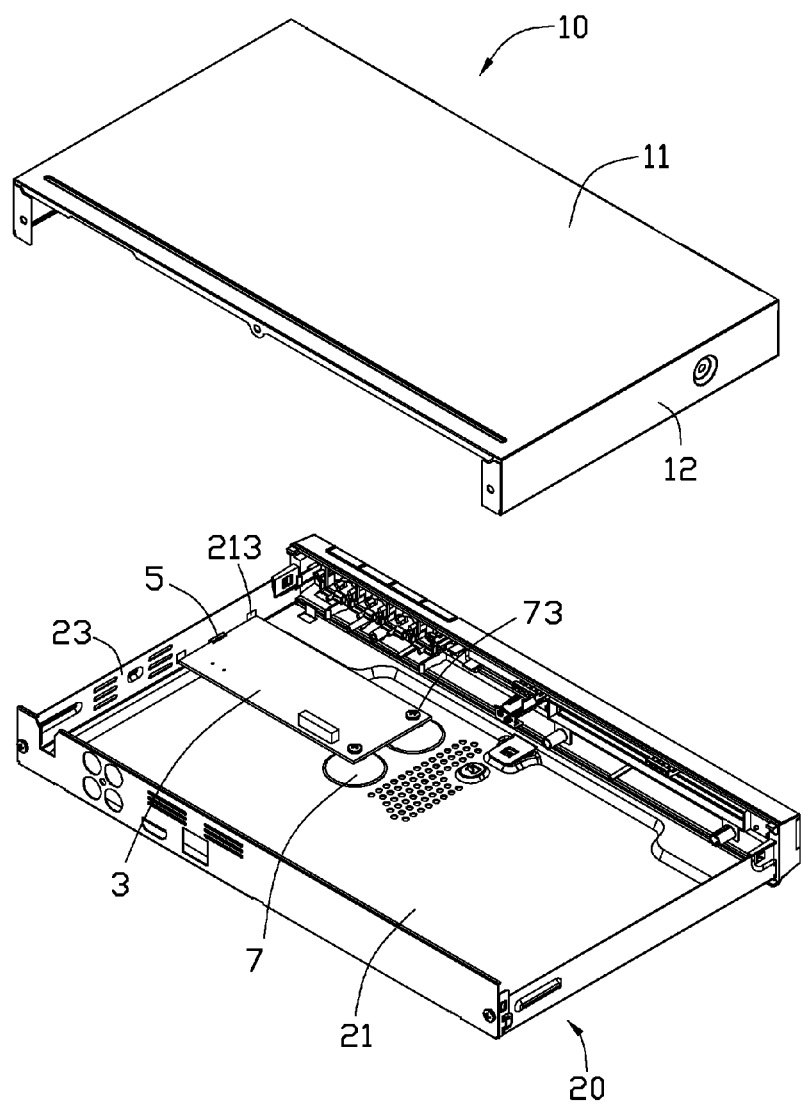
FIG. 2 is a partially disassembled view of the housing of the electronic device of FIG. 1; the electronic device includes an upper cover, a bottom cover and a circuit board.

FIGS. 1 and 2 show an electronic device 100 of the embodiment. The electronic device 100 includes a housing 1, a circuit board 3 received in the housing 1, a fixing portion 5, and a locking portion 7. The fixing portion 5 and the locking portion 7 are mounted in the housing 1 for securing the circuit board 3. In the embodiment, the electronic device 100 is a portable DVD player.

The housing 1 includes an upper cover 10 and a bottom cover 20 covering the upper cover 10. In the embodiment, the bottom cover 2 cooperates with the upper cover 1 to form a closed space (not labeled) to receive the circuit board 3. The upper cover 10 includes a top plate 11 and two first walls 12. The top plate 11 is substantially rectangular. The first walls 12 perpendicularly extend from opposite edges of the top plate 11.

Figure 3:
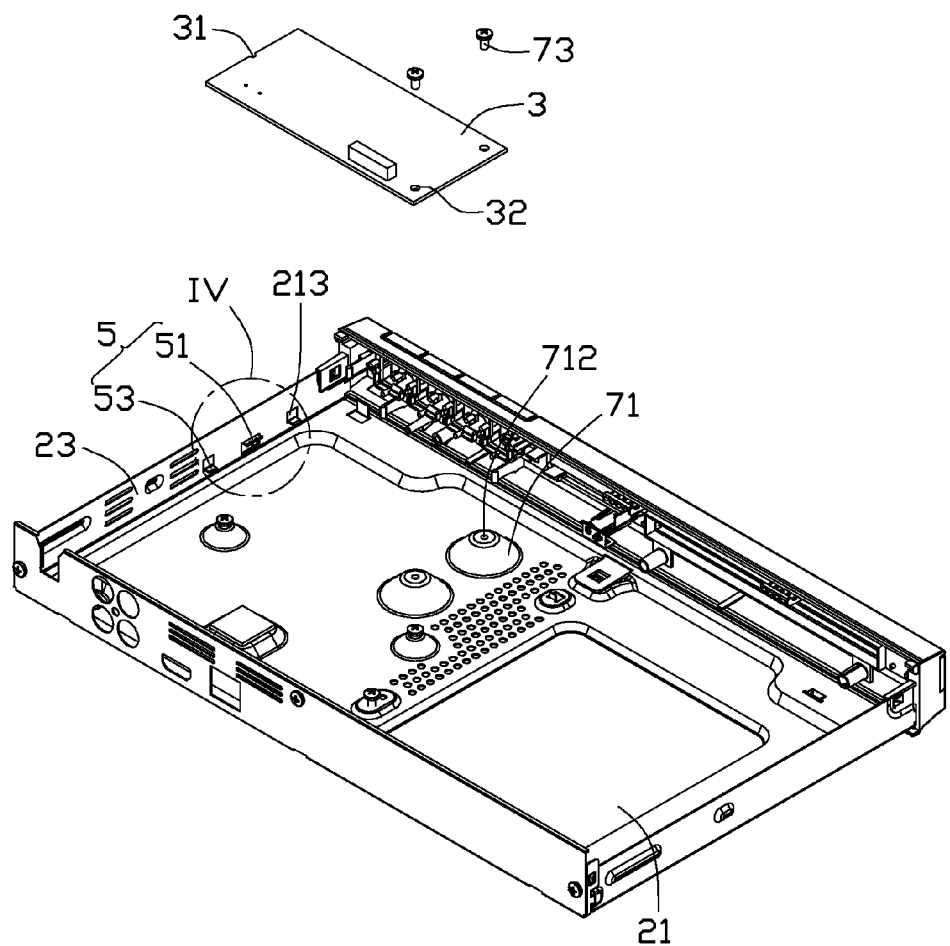
FIG. 3 is a partially disassembled view showing the circuit board disengaged from the bottom cover.
Figure 4:
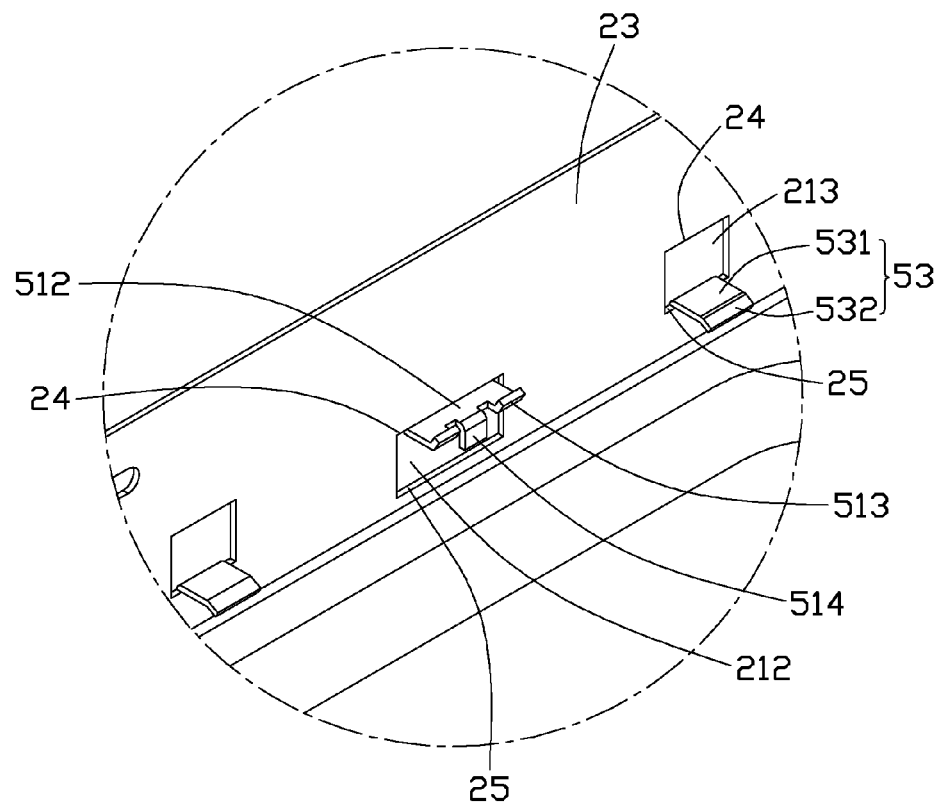
FIG. 4 is a partially enlarged view of part IV of the electronic device of FIG. 3.

Referring to FIGS. 3 and 4, the bottom cover 20 further includes a bottom plate 21 and four sidewalls 23. The four sidewalls 23 extend perpendicularly from the four edges of the bottom plate 21. The bottom plate 21 is substantially rectangular and corresponds to the top plate 11. One of the sidewall 23 defines three operating holes parallel with each other (hereinafter, a first operating hole 212 and two second operating holes 213). The first operating hole 212 is set between the two second operating holes 213. The first operating hole 212 and the second operating holes 213 are substantially rectangular. The center of the first operating hole 212 and the second operating holes 213 are aligned together (not shown) parallel with the bottom plate 21. The first operating hole 212 and the second operating holes 213 respectively include a first edge 24 and a second edge 25 opposite to and parallel with the first edge 24. Both of the first edge 24 and the second edge 25 are parallel with the bottom plate 21. The first edge 24 is away from the bottom plate 21, and the second edge 25 is adjacent to the bottom plate 21. The length of the first edge 24 is longer than that of the second edge 25.

The circuit board 3 is substantially a rectangular plate. In the embodiment, the circuit board 3 is a printed circuit board. The circuit board 3 defines a locking slot 31. The locking slot 31 is set on the center of an edge of the circuit board 3 widthwise. The circuit board 3 further defines two through-holes 32. The through-holes 32 are set on the edge of the circuit board 3 opposite to the locking slot 31. In the embodiment, the through-holes 32 are equidistant from the locking slot 31.

The fixing portion 5 is set on the inner surface of one of the sidewalls 23. In the embodiment, the fixing portion 5 is set on one of the sidewalls 23 parallel with the first wall 12. In other embodiments, a fixing portion 5 can be set on each of the sidewalls 23.

The fixing portion 5 includes a limiting portion 51 and two supporting portions 53. The limiting portion 51 extends from the first edge 24 of the first operating hole 212 and is parallel with the bottom plate 21. The two supporting portions 53 extend from the second edge 25 of the second operating hole 213 and is parallel with the bottom plate 21. The distance between longitudinal planes of the limiting portion 51 and the supporting portion 53 is slightly greater than the thickness of the circuit board 3.

The limiting portion 51 includes a resisting plate 512, two guiding plates 513 parallel with each other, and a blocking plate 514. The resisting plate 512 is substantially rectangular. The resisting plate 512 perpendicularly extends from the first edge 24 of the first operating hole 212 away from the sidewall 23, and is parallel with the bottom plate 21.

The two guiding plates 513 slantingly extend from an end of the resisting plate 512 in a direction away the bottom plate 21. The two guiding plates 513 are spaced from each other at a first predetermined distance.

The blocking plate 514 is disposed between the two guiding plates 513. The blocking plate 514 perpendicularly extends from the end of the resisting plate 512 in a direction adjacent to the bottom plate 21. The blocking plate 514 is spaced from the adjacent guiding plates 513 at a second predetermined distance. In the embodiment, the two guiding plates 513 and the blocking plate 514 extend from the end of the resisting plate 512 away from the sidewall 23 in opposite directions.

Each of the supporting plates 53 includes a supporting plate 531 and a guiding end 532. The supporting plate 531 extends from the second edge 25 of the second operating hole 213 and is parallel to the bottom plate 21. The guiding end 532 extends from an end of the supporting plate 531 away from the sidewall 23 in a direction adjacent to the bottom plate 21.

The locking portion 7 is perpendicularly extends from the bottom plate 21. The locking portion 7 includes two locking parts 71 parallel with each other and two fixing components 73 respectively engaging with the locking parts 71. The line connecting with the two locking part 71 is parallel with the sidewall 23. Each locking parts 71 substantially corresponds to the supporting portion 53. The height of the locking part 71 is equal to the distance between the supporting portion 53 and the bottom plate 21. Each locking part 71 is a substantially frustum of a cone and is perpendicularly set on the bottom plate 21. Each of the locking parts 71 defines a locking hole 712 corresponding to the through-hole 32. The locking hole 712 is a blind hole in a concavity depressed from the upper surface of the locking portion 71 in an axial direction. The inner surface of the locking hole 712 defines a screw thread for engaging with the fixing component 73. The fixing component 73 is screwed into the locking hole 712 to fix the end of the circuit board 3 on the bottom plate 21. In the embodiment, the fixing components 73 are two screws.

Referring to FIG. 2 again, in assembly, the end of the circuit board 3 with the locking slot 31 is set on the guiding end 532. By pushing the circuit board 3 towards the sidewall 23, the end of the circuit board 3 with locking slot 31 is sandwiched between the limiting portion 51 and the two supporting portions 53. The upper surface of the circuit board 3 abuts the limiting plate 512 and the lower surface of the circuit board 3 abuts the supporting plate 531, with the locking slot 31 being locked to the blocking plate 514 for preventing the circuit board 3 moving in the direction parallel with the sidewall 23. The fixing components 713 extend through the through-hole 32 and engage with the locking holes 712 via the two through-holes 32. In the embodiment, the area of the circuit board 3 connected to the locking part 71 is an insulated region for preventing static. As a result, the circuit board 3 is very firmly and steadily mounted on the bottom cover 2.

In disassembly, the fixing components 73 are screwed out of the locking holes 712. By pushing the circuit board 3 away from the sidewall 23 via the first operating hole 212 or one of the second operating holes 213, the circuit board 3 is moved along the guiding plates 513 to move away from the fixing portion 3. As a result, the circuit board 3 can easily disengage with the bottom cover 2.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A housing of an electronic device for securing a circuit board, comprising:
    a fixing portion disposed on a side wall of the housing and parallel with the circuit board; and
    a locking portion perpendicularly mounted on a bottom of the housing;
    wherein the locking portion corresponds the fixing portion, the fixing portion clasps a first end of the circuit board and the locking portion secure to a second end of the circuit board opposite to the first end to mount the circuit board to the housing after the first end of the circuit board is clasped by the fixing portion; the fixing portion comprises a limiting portion and a supporting portion parallel with the limiting portion; both of the limiting portion and the supporting portion are spaced from the bottom of the housing; the limiting portion comprises a resisting plate, two guiding plates, and a blocking plate set between the guiding plates; the guiding plates and the blocking plate are perpendicularly extended from the resisting plate in two opposite directions; the blocking plate is spaced from the guiding plates respectively.

2. The housing of claim 1, wherein the limiting portion and the supporting portion are staggered with each other to sandwiched the circuit board.

3. The housing of claim 1, wherein the supporting portion comprises a supporting plate parallel with the bottom of the housing; the supporting plate cooperates with the resisting plate to sandwich the circuit board.

4. The housing of claim 1, wherein the blocking plate is perpendicularly set on the end of the resisting plate and bent adjacent to the bottom of the housing.

5. The housing of claim 4, wherein the circuit board comprises a locking slot, the locking slot is set on the center of an edge of the circuit board opposite to the blocking plate; the blocking plate is wholly received in the locking slot for preventing the circuit board moving in a horizontal direction.

6. The housing of claim 1, wherein the housing comprises a bottom plate and at least one sidewall perpendicularly extending from an edge of the bottom plate; the at least one sidewall defines at least one operating hole; the at least one operating hole has a first edge parallel to and away from the bottom plate and a second edge opposite to and parallel to the first edge.

7. The housing of claim 6, wherein the limiting portion extends from the first edge of the at least one operating hole and parallel with the bottom plate; the supporting portion extends from the second edge of the at least one operating hole and parallel with the bottom plate.

8. The housing of claim 6, wherein the height of the locking part is equal to the distance between the supporting portion and the bottom plate.

9. The housing of claim 1, wherein a region of the circuit board connected to the locking portion is an insulated region.

10. An electronic device, comprising:
    a housing comprising a bottom plate and at least one sidewall perpendicularly extending from an edge of the bottom plate;
    a fixing portion disposed on the at least one sidewall and parallel with the circuit board; and
    a locking portion perpendicularly mounted on the bottom plate;
    wherein the locking portion corresponds to the fixing portion, the fixing portion clasps a first end of the circuit board and the locking portion secure to a second end of the circuit board opposite to the first end to mount the circuit board to the housing after the first end of the circuit board is clasped by the fixing portion; the fixing portion comprises a limiting portion and a supporting portion parallel with the limiting portion; both of the limiting portion and the supporting portion are spaced from the bottom of the housing; the limiting portion comprises a resisting plate, two guiding plates, and a blocking plate set between the guiding plates; the guiding plates and the blocking plate are perpendicularly extended from the resisting plate in two opposite directions; the blocking plate is spaced from the guiding plates respectively.

11. The electronic device of claim 10, wherein the limiting portion and the supporting portion are staggered with each other to sandwiched the circuit board.

12. The electronic device of claim 10, wherein the supporting portion comprises a supporting plate parallel with the bottom of the housing; the supporting plate cooperates with the resisting plate to sandwich the circuit board.

13. The electronic device of claim 10, wherein the blocking plate is perpendicularly set on the end of the resisting plate and bent adjacent to the bottom of the housing.

14. The electronic device of claim 13, wherein the circuit board comprises a locking slot, the locking slot is set on the center of an edge of the circuit board opposite to the blocking plate; the blocking plate is wholly received in the locking slot for preventing the circuit board moving in a horizontal direction.

15. The electronic device of claim 10, wherein the at least one sidewall defines a first operating hole and at least one second operating hole parallel with the first operating hole; the first operating hole is corresponding to the limiting portion and the second operating hole is corresponding to the supporting portion; the first operating hole and the at least one operating hole are arranged in a line and spaced from each other.

16. The electronic device of claim 15, wherein the limiting portion extends from the first edge of the at least one operating hole and parallel with the bottom plate; the supporting portion extends from the second edge of the at least one operating hole and parallel with the bottom plate.

17. The electronic device of claim 10, wherein the height of the locking part is equal to the distance between the supporting portion and the bottom plate.

18. The electronic device of claim 10, wherein a region of the circuit board connected to the at least one locking portion is an insulated region.

* * * * *